Sept. 22, 1959 B. NIEDERMAN 2,905,909

ELECTROMECHANICAL FILTER

Filed April 16, 1956 2 Sheets-Sheet 1

INVENTOR.
Bernard Niederman
BY
Mueller & Aichele
Attys.

Sept. 22, 1959 B. NIEDERMAN 2,905,909

ELECTROMECHANICAL FILTER

Filed April 16, 1956 2 Sheets-Sheet 2

INVENTOR.
Bernard Niederman
BY Mueller & Aichele
Attys.

United States Patent Office 2,905,909

Patented Sept. 22, 1959

2,905,909

ELECTROMECHANICAL FILTER

Bernard Niederman, Chicago, Ill., assignor to Motorola, Inc., Chicago, Ill., a corporation of Illinois Application April 16, 1956, Serial No. 578,543

16 Claims. (Cl. 333—71)

This invention relates generally to electromechanical devices and more particularly to frequency selective electromechanical devices which may be used in wave signal receivers for selecting the signals therein. This application is a continuation-in-part of my prior application Serial No. 494,780, filed March 16, 1955, and now abandoned.

It has been proposed to use electromechanical filters in radio receivers and other electronic equipments instead of electrical filters as has been generally used. Such electromechanical filters have the advantage of reduction in size and the provision of sharp selectivity. However, prior units have the disadvantage that the characteristics change with changes in temperature, and that responses are present at frequencies other than the desired frequency. Further, prior filters of this type have produced relatively large losses to thereby require additional amplification in the equipment to hold the gain at the desired level.

It is, therefore, an object of the present invention to provide an improved electromechanical wave filter which is of compact and rugged construction.

Another object of the invention is to provide an electromechanical filter which is responsive to a desired band of frequency and which has substantially no response at frequencies outside the desired band.

A further object of the invention is to provide an electromechanical filter wherein the variations in characteristics in response to changes in temperature is minimized over the temperature range used.

A still further object of the invention is to provide an electromechanical filter structure wherein the components may be easily constructed and assembled to provide a rugged structure which will withstand hard usage.

A feature of the invention is the provision of an electromechanical filter including a plurality of vibrating plates interconnected by continuous wires which extend the entire length of the filter, and which are connected to the plates at a plurality of points thereon.

A further feature of the invention is the provision of an electromechanical filter including sections formed of thin plates which vibrate across the narrow dimension and which are connected at nodal points with respect to longitudinal flexural vibrations across the longer dimension so that responses resulting from such flexural vibrations are suppressed in the over-all filter response. The position of the coupling wires along the longitudinal dimensions of the plates also affects the bandwidth of the filter and it may be desirable to move somewhat from a nodal point to provide the desired bandwidth.

Another feature of the invention is the provision of an electromechanical filter structure formed of interconnected flat plates wherein the plates are provided in a rectangular housing with damping means engaging the intermediate plates of the filter and a coating provided on the end plates which are made of magnetostrictive material and placed in coils for coupling to the same. The plates may be positioned in a plane or may be provided on a mounting base which is curved in the direction of propagation through the filter.

Still another feature of the invention is the provision of a compact electromechanical filter structure wherein the filter unit proper includes a plurality of plates coupled by continuous wires, with the unit being mounted between blocks provided in a trough-like housing and with the end plates extending into coils having shielding plates and permanent magnets adjacent thereto, and a rectangular housing having an open bottom which fits over the trough-like housing and sealed thereto to provide a compact, sealed unit.

Further objects, features and the attending advantages of the invention will be apparent from a consideration of the following description when taken in connection with the accompanying drawings wherein.

In practicing the invention, there is provided an electromechanical filter structure formed of a plurality of thin rectangular plates which are interconnected by continuous coupling wires extending across the narrow dimensions of the plates. The end plates are made of magnetostrictive material and positioned in the coils for coupling to electrical circuits. The coupling wires are connected to the intermediate plates at a plurality of points along the plates, with the wires being attached to the nodal points with respect to flexural vibrations across the longer dimensions of the plates. The filter is provided in a compact rectangular housing formed of a first trough-like member having a mounting plate at the bottom on which the intermediate filter plates rest. The end plates extend into coils positioned at the end of the mounting plate. The mounting plate may be conducting or may be insulating with a conducting strip for making electrical contact with one of the plates for grounding the filter structure to the housing. Above the intermediate plates of the filter is a resilient member for damping out flexural vibrations thereof, and above the resilient member is another mounting plate which may have a metallic coating. Tabs extending from the sides of the trough may be bent over to hold the structure in place and these tabs may be soldered to the metallic coating. Conducting shields are provided above the coupling coils for shielding the same with respect to each other. The conducting coating on the top mounting plate and the conducting strip on the bottom mounting plate are also effective in the shielding action. Above the shielding plates are small permanent magnets for producing a biasing field to assist in the magnetostrictive action. A second housing member of rectangular configuration with an open bottom is positioned over the entire assembled structure and sealed to the trough-like member to provide a compact sealed enclosure for the filter unit.

The plates of the filter may be provided in a plane or may be provided on a support which is curved in the direction of the coupling wires. To provide greater selectivity with only slightly greater insertion loss the number of plates may be increased. The position of the coupling wires with respect to the longer dimension of the plates affects the bandwidth of the filter and it may be desired to move the connection from the nodal points to provide the desired bandwidth.

Figure 1:
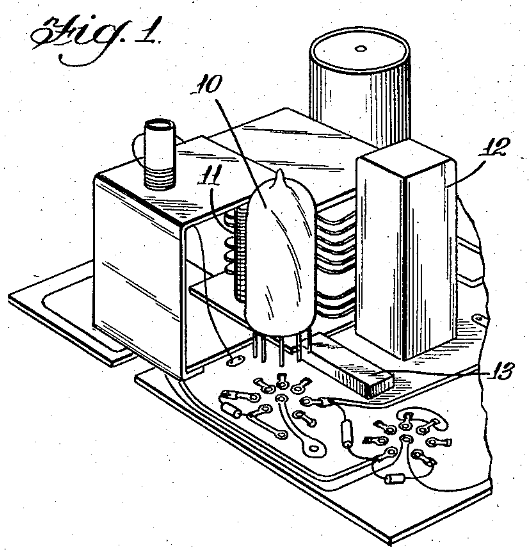
Fig. 1 is a perspective view of a portion of a chassis of an electronic apparatus with the filter thereon.

Referring now to the drawings, in Fig. 1 there is illustrated a portion of a chassis for an electronic apparatus which includes a miniature vacuum tube 10, a tuning condenser 11, a transformer with a shielding housing thereabout 12, and an electromechanical filter 13. This figure shows the relative size of the filter with respect to standard components to show that the unit is extremely small. The dimensions of a representative unit for operation at 455 kc. are 3/8" x 5/8" x 2½". Although the unit is shown on a chassis with miniature vacuum tubes, it may be particularly desirable for use in an equipment including transistors which are also small to thereby provide a very small over-all electronic unit.

Figure 2:
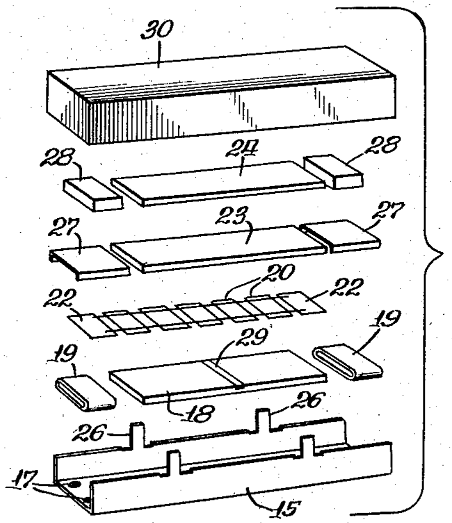
Fig. 2 is an exploded view showing the various parts which make up the filter.
Figure 3:
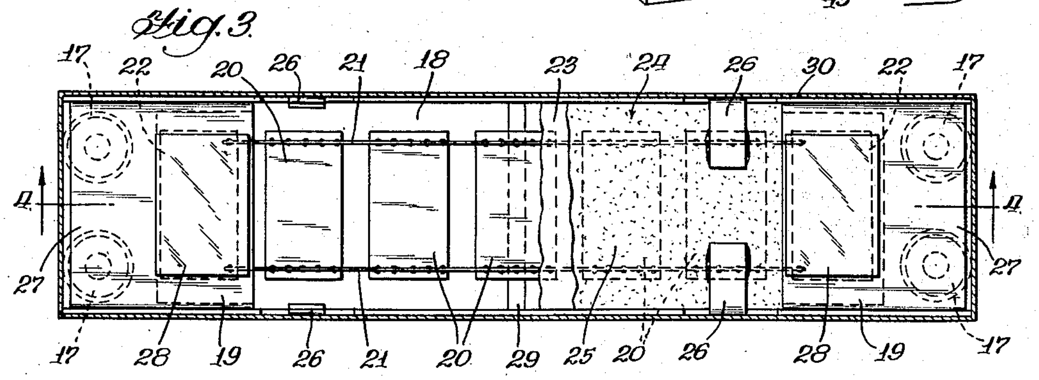
Fig. 3 is a top plan view partly broken away showing the assembled filter.
Figure 4:
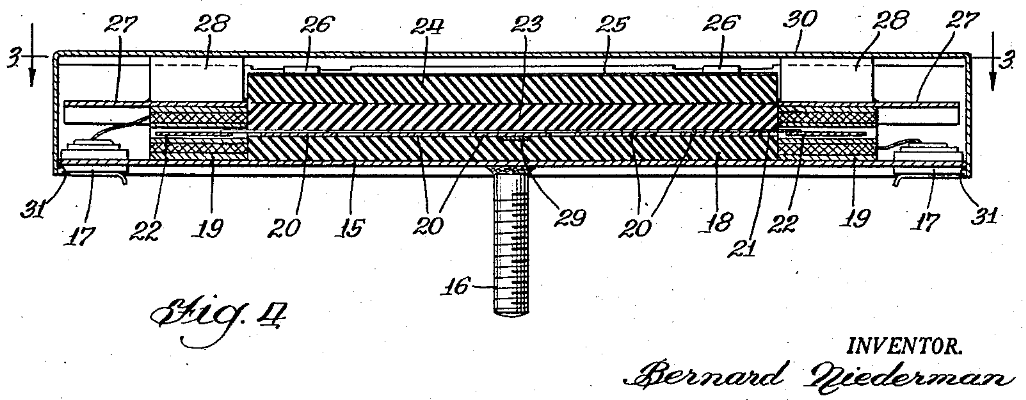
Fig. 4 is a cross-sectional view along the lines 4—4 of Fig. 3.

Figs. 2, 3 and 4 show the construction of the filter which includes a bottom trough-like housing portion 15 which forms the supporting member for the unit. A mounting stud 16 may be secured to the member 15 for mounting the unit on a chassis or the like. Positioned at the ends of the supporting member are terminals 17 for making connections to the coupling coils thereof. Two terminals are shown at each end as is required when the two coupling coils are completely isolated from each other. In many applications it may be possible to provide only a single terminal at each end with the other terminals grounded and connected to the housing member 15.

Resting in the bottom of the trough-like member 15 is a mounting plate 18 which may be made of insulating material such as Bakelite, or may be of metal. At the ends of the plate 18, coils 19 are provided which are positioned with the openings therein aligned with the top surfaces of the plate so that when the filter unit is positioned on the plate 18, the end plates of the filter will extend within the openings in the coil.

The filter unit includes a plurality of plates 20 interconnected by wires 21 which extend continuously across the plates. The end plates 22, which extend in the coils 19, are made of magnetostrictive material so that electric current applied to one coil causes vibrations in the plate positioned therein, which are transmitted down the filter to the other end plate at which the vibrations are converted back into electric currents in the coil thereabout. When the plate 18 is made of insulating material, a conducting strip 29 may be embedded therein on which the center plate of the filter unit rests. This strip may be connected to the housing member 15 to ground the filter unit thereto. Positioned above the filter is a resilient member 23 which may be made of a material such as rubber or a foamy plastic material. This member holds the filter in place but permits limited movement of the plates and the coupling wires and resists flexural vibrations thereof. Above the resilient member is a top mounting block 24 which may have a metallic coating 25 on the top surface thereof. The trough member 15 includes tabs 26 which may be bent over the mounting block 24 and soldered to the metallic coating 25.

Positioned above the coils 19 are metallic shields 27 which are soldered at the ends to the trough member 15. Small permanent magnets 28 are mounted on these shields and are cemented thereto to be held in place. The entire unit is then enclosed by a top housing member 30 having sides enclosing the trough 15 with the components positioned thereon. The bottom edge of the trough and the housing 30 may be soldered together as shown at 31 in Fig. 4 to provide a completely sealed unit.

Considering now the specific construction of the filter, as previously stated, the wires 21 are connected to the plates 20 at several points across the width of the plates.

As shown in Fig. 3 the coupling wires 21 are each connected to each plate 20 at five points thereon. This is accomplished by spot welding the wires to the plates at frequent intervals along the engaging surfaces thereof. This has been found to eliminate spurious responses in the plates to thereby permit the use of less damping of the plates and reduction of the insertion loss of the filter. Also, the use of continuous wires which are tacked down along the plate at several points provides a better mechanical connection and one which is less subject to failure.

The coupling wires 21 are spaced with respect to the ends of the plates 20 so that the wires are connected at nodal points with respect to flexural vibration of the plates across the greater dimension thereof. This eliminates the spurious response normally present at the frequency of such flexural vibrations, and since this is one of the main spurious responses encountered, the elimination thereof results in substantial improvement in the over-all filter response. Because of the elimination of spurious responses by the manner in which the wires are connected to the plates, less damping can be provided as has been previously stated. The use of foamy plastic materials for damping has been found to successfully eliminate undesired responses without substantially attenuating the desired response. Accordingly, the insertion loss of the filter is further reduced.

Figures 6, 7, 8, 9:
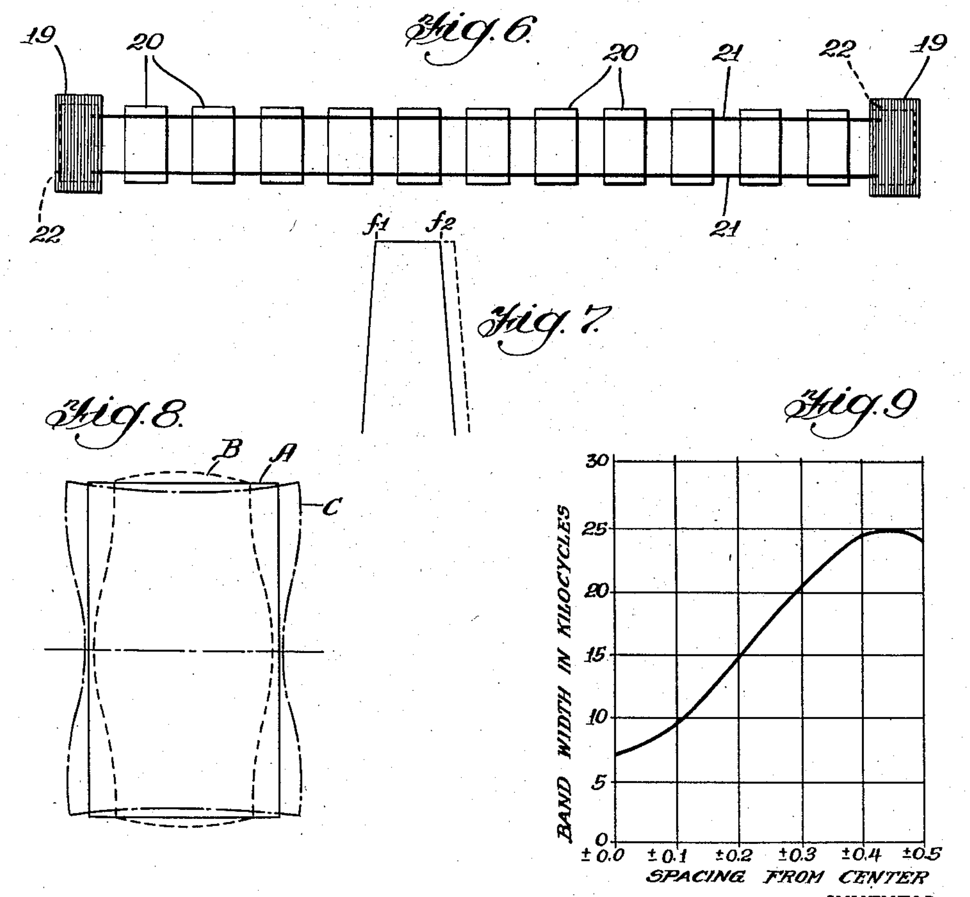
Fig. 6 illustrates a filter made up of a larger number of plates.
Fig. 7 illustrates the pass band characteristics of filters in accordance with the invention.
Fig. 8 illustrates the mode of vibration of the individual plates.
Fig. 9 shows the change in impedance with various positions of the coupling wires.

The frequency characteristics of the filter depend upon many factors. As compressional vibration across the shorter dimension of the plates is used in the filter action, this shorter or transverse dimension of the plates primarily controls the frequency of the filter. More specifically the compressional resonant frequency of the plates in the transverse dimension controls the lower frequency $f_1$ (Fig. 7) of the band to be passed by the filter. The frequency of the plates, however, also depends upon the greater dimension of the plate to some extent. This will be apparent from Fig. 8 which shows the mode of vibration used in the filter action. The solid line A shows the normal configuration of a plate, with the dotted line B showing the compressed position and the dot-dash line C showing the expanded position. Fig. 8 is an exaggerated showing to clearly illustrate the operation. When the ratio of the greater dimension to the smaller dimension is reduced, the shape of the curve of the edge changes to a simple curve with a peak at the center. The change in the vibrating action of the plate with the shape thereof causes the frequency to vary with the greater dimension as well as the smaller dimension of the plates.

The bandwidth of the filter depends primarily upon the impedance of the coupling wires and the impedance of the plates. This controls the position of $f_2$ with respect to $f_1$ of Fig. 7. The bandwidth can be changed as shown by the dotted line in Fig. 7 by changing the plates and/or the coupling wires. The thickness of the plates and the material used therein controls the impedance of the plates, and the diameter of the wires and the material control the impedance of the coupling wires. The bandwidth of the filter, however, also varies with the position of the connection of the coupling wires along the greater dimensions of the plates as described in the copending application of Bernard Niederman and Stanley P. Lapin, Serial No. 379,550, filed September 11, 1953, now Patent No. 2,799,832. Accordingly, the bandwidth of the filter may be controlled by controlling the position of connection of the coupling wires. The curve of Fig. 9 shows the bandwidth in kilocycles for a filter operating at 455 kilocycles, with the point of connection of the coupling wires spaced from the center line of the plate by different fractions of the plate dimension. The ordinate of Fig. 9 shows the bandwidth, and the abscissa the spacing of the wires. In order to obtain the desired bandwidth, it may be desirable to connect the coupling wires at points other than the nodal points with respect to flexural vibration of the plates.

Figure 5:
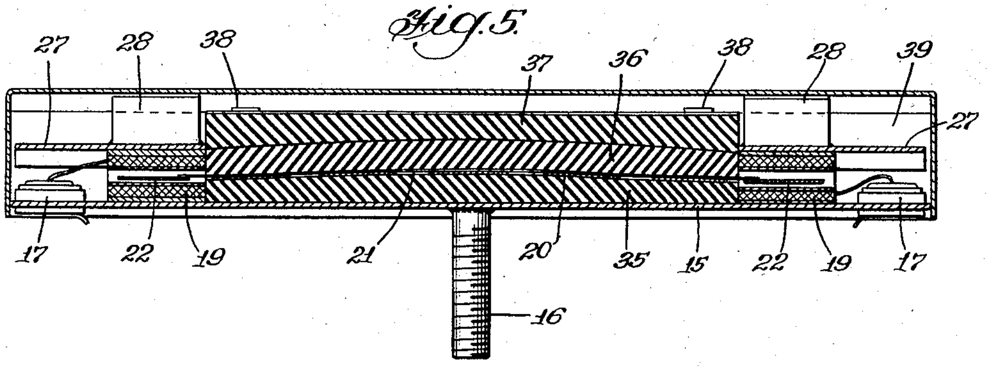
Fig. 5 is a cross-sectional view of a modified filter construction.

Fig. 5 illustrates a construction functioning like that previously described but in which the insulating base or mounting plate 35 has a curved surface. The filter is therefore slightly bowed in the direction of propagation through the filter and such bowing further tends to reduce undesired vibrations of the filter components. The resilient member 36 is easily deformed and will conform to the shape of the mounting plate 35. The top mounting block 37 has a curved lower surface which conforms substantially to the curve of the upper surface of the mounting plate 35. The block 37 is held in position by tabs 38 on the channel member 39 which supports the filter structure as previously described.

Although the filter has been illustrated as including two end plates and five intermediate plates, it is to be pointed out that the number of intermediate plates can be increased to provide added selectivity if this is desired. Filters have been constructed having eleven intermediate plates as shown in Fig. 6 and these have been highly satisfactory in operation. Since the insertion loss is caused to a large extent by the electrical coupling to the unit, and the Q of the intermediate plates is quite high, the addition of plates does not substantially add to the insertion loss. The use of more plates, in addition to increasing selectivity also reduces the spurious responses of the filter. The addition of plates results in an increase of length of the structure by about 1/4" for each additional plate.

In order to provide damping of the end plates, which must rest freely within the coils, it has been found that a coating of a suitable cement may be effective. In addition to providing damping, such a coating may be used to effect the frequency of the plates. The coating may also improve the temperature characteristic of the plates, and prevent oxidation thereof. The impedance of the end plate can be controlled by heat treatment of the nickel or other alloy which is used because of its good magnetostrictive properties. This makes for easy control of the filter characteristics. The end plates should be made of material having low eddy current losses, and the Q of these plates may be low as required by band pass and impedance considerations. The intermediate plates are made of a material such as stainless steel which is affected very little by changes in temperature. The magnets may be made of ferrite materials which provide the required magnetic field without reducing the Q of the plates. This, therefore, further minimizes the losses in the unit.

It is, therefore, seen that a very simple and compact electromechanical filter structure is provided. By providing coupling wires extending continuously across the plates, by connecting the wires at a plurality of points to each plate, and by connecting to the plates at nodal points with respect to flexural vibrations, the spurious responses of the unit are greatly reduced. The use of a curved base which bows the unit slightly may also reduce spurious responses. This makes it possible to reduce the damping previously used so that the losses of the filter are reduced. Accordingly, the filter provided has no objectionable spurious responses and has very low insertion losses. The position of the coupling wires may also be selected to provide the bandwidth desired in the unit. In many cases it is possible to position the coupling wires substantially at the nodal points and at the same time at a point which provides the bandwidth required. This may be made possible by proper selection of the diameter and material of the coupling wires.

I claim:

1. In an electromechanical filter for passing frequencies within a predetermined band and for substantially attenuating other frequencies, a mechanical filter structure including in combination, a plurality of thin plates positioned in a plane, each of said plates having one portion with a dimension such that the natural frequency of compressional vibration thereacross falls in said predetermined frequency band, a pair of spaced continuous coupling wires extending across said portions of said plates and connected to each plate at a plurality of points, said points of connection of said coupling wires to said plates being at nodal points thereof with respect to flexural vibration of the plates along a direction perpendicular to said coupling wires, whereby responses from such flexural vibration are suppressed.

2. In an electromechanical filter for passing frequencies within a predetermined band and for substantially attenuating other frequencies, a mechanical filter structure including in combination, a plurality of thin rectangular plates positioned in a plane, the rectangle of each of said plates having a shorter dimension and a longer dimension at right angles to said shorter dimension, said plates having said shorter dimension thereof selected so that the natural frequency of compressional vibration thereacross falls in said predetermined frequency band, a pair of coupling wires extending continuously across said shorter dimension of said plates and connected to each plate at a plurality of points thereon, said coupling wires being connected to said plates at nodal points thereof with respect to flexural vibration of the plates along said longer dimension thereof, whereby responses from such flexural vibration are suppressed.

3. In an electromechanical filter for passing frequencies within a predetermined band and for substantially attenuating other frequencies, a mechanical filter structure including in combination, a plurality of thin rectangular plates positioned in a plane, the rectangle of each of said plates having a shorter dimension and a longer dimension at right angles to said shorter dimension, said plates having said shorter dimension thereof selected so that the natural frequency of compressional vibration thereacross falls in said predetermined frequency band, a pair of coupling wires extending continuously across said plates and connected to each plate at the nodal points thereof with respect to flexural vibration of the plates along said longer dimension thereof, whereby responses from such flexural vibration are suppressed.

4. In an electromechanical filter for passing frequencies within a predetermined band and for rejecting other frequencies, a mechanical filter structure including in combination, a plurality of thin rectangular plates having longer sides and shorter sides at right angles thereto, said plates being positioned in a plane with the longer sides thereof spaced in parallel relation, each of said plates having the shorter sides thereof of such dimension that the natural frequency of compressional vibration thereacross falls in said predetermined frequency band, a pair of coupling wires extending continuously across said plurality of plates and connected to each plate at a plurality of points, said points of connection of said coupling wires to said plates being at nodal points thereof with respect to flexural vibration along the longer sides of the plates, whereby responses from such flexural vibration of said plates are not applied through said coupling wires.

5. An electromechanical filter for passing frequencies within a predetermined band and for rejecting other frequencies including in combination, a plurality of thin rectangular plates having longer sides and shorter sides at right angles thereto, said plates being positioned in a plane with the longer sides thereof spaced in parallel relation, each of said plates having the shorter sides thereof of such dimension that the natural frequency of compressional vibration thereacross falls in said predetermined frequency band, a pair of coupling wires extending continuously across said plurality of plates and connected thereto to form a ladder-like structure, said coupling wires being connected to said plates at nodal points thereof with respect to flexural vibration along the longer sides of the plates, the end plates of said structure being formed of magnetostrictive material and having a damping coating thereon, transducer means cooperating with said end plates and including coupling coils positioned about said end plates, and resilient means engaging said plates intermediate said end plates for restraining flexural vibrations thereof.

6. An electromechanical filter structure including in combination, an elongated trough-like housing part of conducting material including upturned sides with projecting tabs extending therefrom, a mounting plate positioned in said housing part intermediate the ends thereof, first and second coupling coils positioned in said housing part at the ends of said mounting plate, a filter unit including end plates and a plurality of intermediate plates interconnected by coupling wires, said filter unit being positioned with said end plates within said coils and said intermediate plates on said mounting plate, a resilient member engaging said intermediate plates of said filter unit, a top mounting plate positioned on said resilient member, said projecting tabs of said housing part being bent over to engage said top mounting plate, shield plates positioned above said coils and electrically connected to said housing part, permanent magnets positioned on said shield plates and secured thereto, said end plates being made of magnetostrictive material and cooperating with said coils and said permanent magnets to provide electromechanical action, and a second rectangular housing part having top and side walls and an open bottom, said second housing part being positioned over the aforesaid components with the sides thereof fitting closely about said trough-like housing part and sealed thereto to provide a completely sealed filter structure.

7. An electromechanical filter structure including in combination, an elongated trough-like housing part of conducting material including upturned sides with projecting tabs extending therefrom, an insulating mounting plate positioned in said housing part intermediate the ends thereof, first and second coupling coils positioned in said housing part at the ends of said mounting plate, a filter unit including end plates and a plurality of intermediate plates interconnected by coupling wires, said filter unit being positioned with said end plates within said coil and said intermediate plates on said mounting plate, said mounting plate including a conducting portion connected to said housing part for engagement with an intermediate plate of said filter unit for connecting the same to said housing part, a resilient member positioned on top of said intermediate plates of said filter unit, a top mounting plate formed of insulating material with a coating of conducting material on the top side thereof, said top mounting plate being positioned on said resilient member, said projecting tabs of said housing part being bent over to engage said conducting coating and being mechanically connected thereto, shield plates positioned above said coils and electrically connected to said housing part, permanent magnets positioned on said shield plates and secured thereto, said end plates being made of magnetostrictive material and cooperating with said coils and said permanent magnets to provide electromechanical action, and a second rectangular housing part having top and side walls and an open bottom, said second housing part being positioned over the aforesaid components with the sides thereof fitting closely about said trough-like housing part and sealed thereto to provide a completely sealed filter structure.

8. An electromechanical filter structure for passing frequencies within a predetermined band and rejecting other frequencies including in combination, an elongated trough-like housing part of conducting material including upturned sides with projecting tabs extending therefrom, a mounting plate positioned in said housing part intermediate the ends thereof, first and second coupling coils positioned in said housing part at the ends of said mounting plate, a filter unit including a pair of end plates and a plurality of intermediate plates positioned in a plane, said plates being thin and rectangular with shorter sides and longer sides at right angles thereto, said shorter sides of said rectangular plates having such dimension that the natural frequency of compressional vibration thereacross falls in said predetermined frequency band, a pair of coupling wires extending continuously across said plurality of plates and connected to each intermediate plate at a plurality of points thereacross, said coupling wires being connected to said rectangular plates at nodal points thereon with respect to flexural vibration along the longer sides of the plates, said end plates of said filter unit being positioned within said coils and said intermediate plates thereof being positioned on said mounting plate, a resilient member engaging said intermediate plates of said filter unit, a top mounting plate positioned on said resilient member, said projecting tabs of said housing part being bent over to engage said top mounting plate, shield plates positioned above said coils and electrically connected to said housing part, permanent magnets positioned above said shield plates and secured thereto, said end plates being made of magnetostrictive material and cooperating with said coils and said permanent magnets to provide electromechanical action, and a second rectangular housing part having top and side walls and an open bottom, said second housing part being positioned over the aforesaid components with the sides thereof fitting closely about said trough-like housing part and sealed thereto to provide a completely sealed filter structure.

9. An electromechanical filter structure for passing frequencies within a predetermined band and rejecting other frequencies including in combination, an elongated trough-like housing part of conducting material including upturned sides with projecting tabs extending therefrom, a mounting plate positioned in said housing part intermediate the ends thereof, first and second coupling coils positioned in said housing part at the ends of said mounting plate, terminals extending through said housing part connected to said coils, a filter unit including a plurality of thin rectangular plates having longer sides and shorter sides at right angles thereto, said plates being positioned with the longer sides thereof spaced in parallel relation, each of said rectangular plates having the shorter sides thereof of such dimension that the natural frequency of compressional vibration thereacross falls in said predetermined frequency band, a pair of coupling wires extending continuously across said plurality of plates and connected to each plate at nodal points thereof with respect to flexural vibration along the longer sides of the plates, the end plates of said filter unit being positioned within said coils and the intermediate plates thereof being positioned on said mounting plate, said coupling wires being connected to said intermediate plates at a plurality of points thereon, a resilient member engaging said intermediate plates of said filter unit, a coating of damping material on said end plates, a top mounting plate having a conducting top surface, said top mounting plate being positioned on said resilient member, said projecting tabs of said housing part being bent over to engage said conducting surface and being mechanically connected thereto, shield plates positioned above said coils and electrically connected to said housing part, permanent magnets formed of ferrite positioned on said shield plates and secured thereto, said end plates being made of magnetostrictive material and cooperating with said coils and said permanent magnets to provide electromechanical action, and a second rectangular housing part having top and side walls and an open bottom, said second housing part being positioned over the aforesaid components with the sides thereof fitting closely about said trough-like housing part and sealed thereto to provide a completely sealed filter structure.

10. An electromechanical filter structure for passing frequencies within a predetermined band and rejecting other frequencies including in combination, an elongated trough-like housing part of conducting material including upturned sides with projecting tabs extending therefrom, an insulating mounting plate positioned in said housing part intermediate the ends thereof, first and second coupling coils positioned in said housing part at the ends of said mounting plate, a filter unit including a plurality of thin rectangular plates having longer sides and shorter sides at right angles thereto, said plates being positioned in a plane with the longer sides thereof spaced in parallel relation, each of said rectangular plates having the shorter sides thereof of such dimension that the natural frequency of compressional vibration thereacross falls in said predetermined frequency band, a pair of coupling wires extending continuously across said plurality of plates and connected to each plate at nodal points thereof with respect to flexural vibration along the longer sides of the plates, the end plates of said filter unit being positioned within said coils and the intermediate plates thereof being positioned on said mounting plate, conducting means on said mounting plate connected to said housing part and positioned to engage said filter unit, a resilient member positioned to engage said intermediate plates of said filter unit, a top mounting plate formed of insulating material with a coating of conducting material on the top side thereof, said top mounting plate being positioned on said resilient member, said projecting tabs of said housing part being bent over to engage said conducting coating, shield plates positioned above said coils and electrically connected to said housing part, permanent magnets positioned on said shield plates and secured thereto, said end plates being made of magnetostrictive material and cooperating with said coils and said permanent magnets to provide electromechanical action, and a second rectangular housing part having top and side walls and an open bottom, said second housing part being positioned over the aforesaid components with the sides thereof fitting closely about said trough-like housing part and sealed thereto to provide a completely sealed filter structure.

11. An electromechanical filter for passing frequencies within a predetermined band and for substantially attenuating other frequencies including in combination, a plurality of thin rectangular plates having a shorter dimension and a longer dimension at right angles to the shorter dimension, said dimensions being selected so that the natural frequency of compressional vibration across the shorter dimension of said plates defines the lower limit of said predetermined frequency band, a pair of coupling wires extending continuously across the shorter dimension of said plates and connected to each plate at a plurality of points thereon, transducer means connected to said coupling wires at one end thereof for converting electrical signals into mechanical vibrations, transducer means connected to said coupiing wires at the other end thereof for converting mechanical vibrations into electrical signals, and resilient means engaging said plates and said coupling wires for holding the same in place and for suppressing undesired vibration thereof.

12. An electromechanical filter for passing frequencies within a predetermined band and for substantially attenuating other frequencies including in combination, a plurality of thin rectangular plates having a shorter dimension and a longer dimension at right angles to the shorter dimension, said dimensions being selected so that the natural frequency of compressional vibration across the shorter dimension of said plates defines the lower limit of said predetermined frequency band, a pair of coupling wires extending continuously across the shorter dimension of said plates, each of said wires being connected to each plate at more than two points across the shorter dimension of the plate, transducer means connected to said coupling wires at one end thereof for converting electrical signals into mechanical vibrations, transducer means connected to said coupling wires at the other end thereof for converting mechanical vibrations into electrical signals, and resilient means engaging said plates and said coupling wires for holding the same in place for suppressing undesired vibration thereof.

13. An electromechanical filter for passing frequencies within a predetermined band and for substantially attenuating other frequencies including in combination, a plurality of thin rectangular plates having longer and shorter dimensions such that the natural frequency of compressional vibration across the shorter dimension thereof defines the lower limit of said predetermined frequency band, a pair of coupling wires extending continuously across the shorter dimension of said plates and connected to each plate at a plurality of points thereon, magnetostrictive end plates connected to said coupling wires at the ends thereof, transducer means including coils about said end plates for coupling electrical signals thereto, said end plates being made of material having low eddy current losses and relatively low Q as compared to the Q of said plurality of plates of the filter, and resilient means engaging said plurality of plates and said coupling wires for holding the same in place and for suppressing undesired vibration thereof.

14. An electromechanical filter for passing frequencies within a predetermined band and for substantially attenuating other frequencies including in combination, a plurality of thin rectangular plates having a shorter dimension and a longer dimension at right angles to the shorter dimension, said dimensions being selected so that the natural frequency of compressional vibration across the shorter dimension of said plates defines the lower limit of said predetermined frequency band, a pair of coupling wires extending continuously across the shorter dimension of said plates and each wire being connected to each plate at at least three points thereon, said coupling wires being connected to said plates at positions along the longer dimension of the plates to provide the desired band pass of the filter, transduced means connected to said coupling wires at one end thereof for converting electrical signals into mechanical vibrations, transducer means connected to said coupling wires at the other end thereof for converting mechanical vibrations into electrical signals, and resilient means engaging said plates and said coupling wires for holding the same in place and for suppressing undesired vibration thereof.

15. An electromechanical filter for passing frequencies within a predetermined band and for substantially attenuating other frequencies including in combination, a plurality of thin rectangular plates having a shorter dimension and a longer dimension at right angles to the shorter dimension, said dimensions being selected so that the natural frequency of compressional vibration across the shorter dimension of said plates defines the lower limit of said predetermined frequency band, a pair of coupling wires extending continuously across the shorter dimension of said plates and each wire being connected to each plate at at least three points thereon, said coupling wires being connected to said plates substantially at nodal points with respect to flexural vibration of the plates thereof, with the points of connection being selected to provide the desired band pass of the filter, transducer means connected to said coupling wires at one end thereof for converting electrical signals into mechanical vibrations, transducer means connected to said coupling wires at the other end thereof for converting mechanical vibrations into electrical signals, and resilient means engaging said plates and said coupling wires for holding the same in place and for suppressing undesired vibration thereof.

16. An electromechanical filter for passing frequencies within a predetermined band and for substantially attenuating other frequencies including in combination a plurality of thin rectangular plates having a shorter dimension and a longer dimension at right angles to the shorter dimension, said dimensions being selected so that the natural frequency of compressional vibration across the shorter dimension of said plates defines the lower limit of said predetermined frequency band, a pair of coupling wires extending continuously across the shorter dimension of said plates and connected to each plate at a plurality of points thereon, a supporting base for said plates having a convex supporting surface which is curved in the direction of propagation of vibration through the filter, transducer means connected to said coupling wires at one end thereof for converting electrical signals into mechanical vibrations, transducer means connected to said coupling wires at the other end thereof for converting mechanical vibrations into electrical signals, and resilient means engaging said plates and said coupling wires for holding the same in place and for suppressing undesired vibration thereof.

References Cited in the file of this patent

UNITED STATES PATENTS

| | | |
|---|---|---|
| 1,788,519 | Harrison | Jan. 13, 1931 |
| 2,652,542 | Anthony et al. | Sept. 15, 1953 |
| 2,799,832 | Niederman et al. | July 16, 1957 |
| 2,802,992 | Doelz | Aug. 13, 1957 |